United States Patent Office

3,387,976

Patented June 11, 1968

3,387,976

PHOTOPOLYMER AND LITHOGRAPHIC PLATES

Jack L. Sorkin, Cleveland Heights, Ohio, assignor to Harris-Intertype Corporation, Cleveland, Ohio, a corporation of Delaware No Drawing. Filed July 22, 1964, Ser. No. 384,533
18 Claims. (Cl. 96—86)

ABSTRACT OF THE DISCLOSURE

A photopolymer for use in photolithography and photomechanical processes comprising a high molecular weight phenoxy-cinnamate polymer containing the following recurring structure:

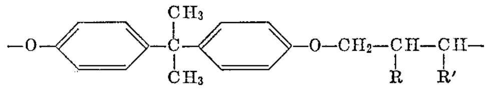

in which R and R′ are hydrogen or cinnamate substituents. To provide the necessary light sensitivity, either R or R′ will be a cinnamate substituent. This photopolymer is made by reacting a high molecular weight phenoxy resin with cannamoylating agent, such as cinnamoyl chloride, in the presence of a solvent and subsequently precipitating the phenoxy-cinnamate from the solvent.

This invention relates generally as indicated to a new photopolymer for use in photolithography and photomechanical processes, and more particularly relates to an inherently light sensitive photopolymerizable composition for such use.

For many years, photomechanical reproduction has depended primarily upon the use of a colloidal layer of gum arabic or other similar material containing a photosensitive hardening agent such as a bichromate salt. More recently, the use of light sensitive diazo compounds has resulted in the manufacture of presensitized plates, i.e., plates to which the light sensitizing agent may be applied prior to actual use. The bichromated colloids and the diazo compounds, however, have several material disadvantages which restrict their application and use.

One such inherent disadvantage of the diazo compounds, for example, is their tendency to decompose chemically upon contact with a metal surface. Consequently, when a diazo compound is to be used over a metal plate, an intervening protective sublayer must be used. If the sublayer is not properly formed, the resulting lithographic plate may be defective or have a short storage life.

Bichromated colloids deteriorate relatively rapidly after coating thus making them unsuitable for use when long shelf life is desired. Moreover, many of the colloidal light sensitive materials presently employed as resists for etching require a relatively high temperature oven bake prior to use, thereby increasing the cost and complicating the process of preparation.

It is therefore a principal object of this invention to provide an inherently light sensitive photopolymer for use in the graphic arts and particularly in preparing or forming surface type lithographic plates and etching resists.

It is a further object of this invention to provide a photopolymer which may be applied directly in contact with a metal support member, or over such a member having a sublayer thereon.

Yet another object is to provide a photopolymer which may be applied directly to many different types of metal surfaces, such as steel, copper and aluminum without producing undesirable effects.

A further object of this invention is to provide a photopolymer which is suitable for a variety of uses in lithographic and photomechanical processes, such as in the production of printed circuits, and chemical milling and etching processes.

An additional object of this invention is to provide a photopolymer which permits the utilization of an automated process in the preparation of printing plates for use in lithographic operations by being capable of being developed by organic solvents.

A further object is the provision of a new photopolymer which may be developed by either organic solvents or emulsion developers.

Other objects, features and advantages of this invention will become apparent to these skilled in the art after a reading of the following more detailed description.

These and other objects are achieved by means of this invention in which novel organic compounds are provided which are soluble in organic solvents but undergo chemical reaction upon exposure to actinic light to become cross-linked and insoluble in such solvents. Specifically, the invention includes a light sensitive photopolymerizable composition comprising a high molecular weight phenoxy-cinnamate ploymer containing as a recurring structure:

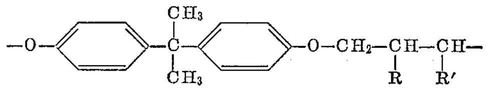

wherein R and R′ are members selected from the group consisting of hydrogen and cinnamate substituents. As will be more thoroughly explained, such composition may also include any of the usual sensitizing agents or polymerization inhibitors and accelerators if desired.

The photopolymerizable composition of the present invention is prepared by reacting a high molecular weight phenoxy resin, which is a polyhydroxy ether containing about 6 percent by weight of hydroxyl groups and having a molecular weight of at least about 20,000, with a cinnamoylating agent in the presence of a solvent. The phenoxy-cinnamate composition thus resulting is subsequently precipitated and recovered from the solvent.

The terminology "phenoxy resin" as used herein refers to the above-described high molecular weight polyhydroxy ethers with the following molecular structure:

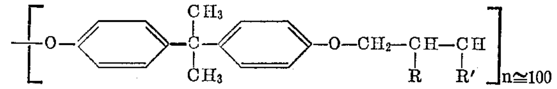

wherein R and R′ are members selected from the group consisting of hydrogen and hydroxide. Otherwise stated, the ether compound may contain primary or secondary alcohol groups depending upon the nature of the reaction by which the compound is produced.

These compounds are generally formed by copolymerization of bisphenol A [2,2-bis (p-hydroxyphenyl) propane] and epichlorohydrin as illustrated below:

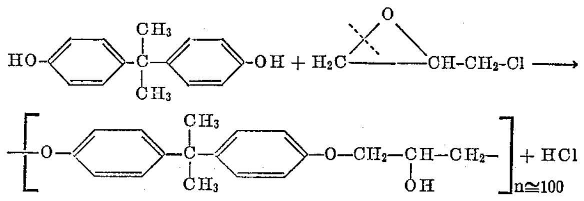

The phenoxy compound resulting from this reaction will have primary or secondary hydroxyl groups within the bracketed recurring structure depending upon which of the oxygen bridges of the terminal epoxide ring of the epichlorohydrin is broken during the reaction.

Thus, as shown above, when the oxygen bridge on the lefthand side of the ring is broken, as shown by the dotted line, a secondary hydroxyl group is produced within the recurring structure, which will generally be the reaction which occurs. If, however, the other oxygen bridge is broken (as shown in the reaction below), the phenoxy compound will have a terminal hydroxyl group within the recurring structure.

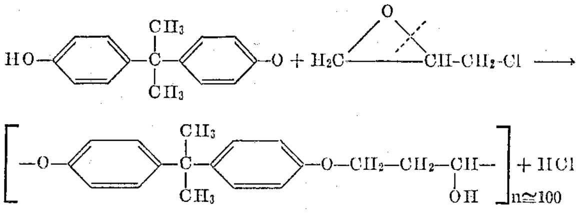

If an excess of epichlorohydrin is used during the copolymerization reaction, the polymer chain may have primary or secondary hydroxyl groups, depending upon which oxygen bridge is broken, since the polymer will have terminal epoxide rings prior to complete hydrolysis. If an excess of bisphenol A is used, however, the compound will have terminal phenolic hydroxyl groups.

The phenoxy resins which are used in this invention are to be distinguished from presently available epoxide resins which are based on similar raw materials, since the phenoxy resins contain no epoxy rings, i.e., there are no oxygen atoms attached to two different atoms of a chain as in 1,2 epoxy propane,

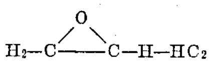

Rather, the phenoxy resin has the "phenoxy group" present, i.e.,

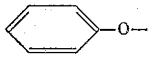

Moreover, the phenoxy resins have substantially higher molecular weights than the epoxy resins which are commercially known, being about ten to thirty times higher. The phenoxy resins usually have a molecular weight of at least about 20,000, generally 20,000 to 30,000, and may be even higher if desirable to produce a tougher film and one with greater insolubility after exposure to an actinic light source. In contrast, most epoxy resins are available in liquid form, with the highest molecular weight of such resins usually about 2,500 to 4,000. Additionally, phenoxy resins have an essentially linear molecular structure and do not require chemical curing to be suitable for use in lithographic processes.

The phenoxy resins used in this invention are produced according to the aforedescribed reactions and are also commercially available under the trade designation, "Bakelite" PKDA resins. Reference may also be made to Modern Plastics Encyclopedia for 1964, vol. 41, No. 1A, pages 209 and 210, for a detailed discussion of such compounds.

Typical properties of such phenoxy resins are set forth in the following table.

TABLE I

| | |
|---|---|
| Approximate molecular weight | 20,000–30,000 |
| Specific gravity | 1.18 |
| Reduced viscosity (0.2 g./100 ml. dimethylformamide) | 0.4–0.7 |
| Ultimate tensile strength, p.s.i. | 9,000–9,500 |
| Ultimate tensile elongation, percent | 50–100 |
| Softening temperature, ° F. | 212 |
| Permeability (1 mil free film, 25° C.): | |
| Water vapor (g./mil/24 hrs./100 in.$^2$) | 3.5 |
| Oxygen (cc./mil/24 hrs./100 in.$^2$) | 5–8 |
| Carbon dioxide (cc./mil/24 hrs./100 in.$^2$) | 15–30 |
| Bulking value, lbs./gal. | 9.83 |

The above-described phenoxy resins may be cinnamoylated by use of any of the presently available cinnamoylating compounds which contain the cinnamoyl radical and which are capable of attaching to the polymer through reaction with hydroxyl groups of the polyhydroxy ether. Exemplary of cinnamoylating agents useful in preparing the photopolymer are the following: cinnamic acid, halocinnamic acid, methoxycinnamic acid, nitrocinnamic acid, acid halides of such acids, as for example cinnamoyl chloride, acid amides of such acids, such as cinnamic acid amides, cinnamic acid dimethylamide, and cinnamic acid ethanolamide, and cinnamate substituents containing conjugated unsaturation. Reference may also be made to the list of such agents in U.S. Patent 3,030,208 which are suitable for use in this invention to attach cinnamate substituents to the ether. The terminology "'cinnamate substituents" as used herein refer to the cinnamate side chains which are attached to the ether backbone of the polymer by ester linkages and includes such chains of any of the abovementioned cinnamoylating agents.

The phenoxy resin and cinnamoylating agent are reacted in a solvent which will not react with the hydroxyl groups of the phenoxy resin and thereby compete with the cinnamoylating agent for such reaction or react with the cinnamoylating agent and thus prevent it from reacting with the phenoxy resin. The cinnamoylating agent will react with the hydroxyl groups of the phenoxy resin to produce cinnamate side chains attached to the phenoxy ether by ester linkages. Numerous solvents are suitable for use, with the following list being set forth for illustrative purposes. Examples of such solvents are dioxane, n-methyl pyrrolidone, butyl carbitol acetate, cellosolve acetate, diethyl carbitol, dimethylformamide, dimethyl sulfoxide, mesityl oxide, methyl cellosolve acetate, methyl ethyl ketone, a mixture of methyl ethyl ketone, cellosolve acetate and toluene (since the phenoxy resin will not readily dissolve in toluene, it is preferable to preblend it with another solvent, such as those mentioned) or methyl ethyl ketone and toluene, and tetrahydrofuran. The preferred solvents are dioxane and n-methyl pyrrolidone.

To react the phenoxy resin with the cinnamoylating agent, the phenoxy resin is dissolved in the solvent, and an excess of the cinnamoylating agent, such as cinnamoyl chloride, is added. Heat is applied with stirring at atmospheric pressure, and a stream of air may be passed over the solution to remove hydrogen chloride gas which is evolved by the reaction. The solution is preferably heated to a temperature which is below the boiling point of the particular solvent being used; for example, the solution may be heated to a temperature in the range of from about 80 to 100° C. when dioxane is the solvent, or about 80 to 112° C. when n-methyl pyrrolidone is used. When the latter solvent is used, it is not necessary to remove the hydrogen chloride gas, since the solvent, being a heterocyclic compound with a five membered nitrogen containing ring structure, acts as a catalyst for the reaction by tying up the hydrogen chloride within the solution as it is formed.

The phenoxy-cinnamate composition thus formed is thereafter precipitated from the solvent by the use of an alcohol which is compatible with the solvent but incompatible with the resin. An example of suitable alcohol is methanol, although others may also be used such as ethanol, propanol, butanol, etc. If the solvent is compatible in water, the resin may also be precipitated by the use of water. The product is recovered, after purifying and washing, generally as a fine powder.

As previously noted, an excess of cinnamoylating agent may be used to insure that all of the hydroxyl groups in the phenoxy resin will be reacted with the agent to produce the cinnamate side chains which are attached by ester linkages. When an excess of this agent is used, each hydroxyl group of the polymer will be reacted with the agent, although it is not necessary for all such groups to be reacted in order to produce a suitable photopolymer. In general, the more esterification which occurs, the more photosensitive the phenoxy-cinnamate will be.

It is generally desirable, therefore, to use an excess of the cinnamoylating agent to insure complete reaction. It is possible to use an excess of this agent since the alcohol employed to precipitate the phenoxy-cinnamate composition will dissolve the excess cinnamoylating agent, i.e., the cinnamoylating agent is soluble in the alcohol, and thus will be kept in solution when the polymer is precipitated.

After recovery of the phenoxy-cinnamate composition, it is generally incorporated with a suitable sensitizing agent, which serves as a catalyst for the polymerization reaction produced by the actinic light to which the composition will be exposed after application to a suitable support. The incorporation is usually achieved by dissolving the phenoxy-cinnamate in a suitable solvent, such as any of those listed above, and also dissolving therein the desired sensitizing agent. Illustrative examples of suitable sensitizing agents are: Michler's ketone, picric acid, 2,4,6 trinitrobenzoic acid, 1,2 benzanthraquinone, 2,5 diphenyl-p-quinone, 4,4 tetraethyl diamino diphenyl ketone, 4,4′ tetramethyl diamino diphenyl carbinol, 4,4 tetramethyl diamino benzophenone imide, 1-methyl-2 benzoylmethylene - beta - naphthothiazoline, 4,4 diazidostilbene-2,2′ disulfonic acid and auramine base. Also exemplary of sensitizers which may be used are those listed in United States Patents 2,610,120, 2,690,966, 2,670,285, 2,670,286, 2,670,287 and 2,732,301. The sensitizer may be applied either in solution with the polymer or separately from a suitable solvent over the photopolymer after it has been applied to a support member. It is preferable, however, that the sensitizing agent be applied in a solution with a phenoxy-cinnamate polymer.

After a solution of the phenoxy-cinnamate and sensitizer has been formed, it may be applied to a support member in any manner, such as by dipping, spraying, whirler coating, etc., after which the solvent is evaporated either by air drying or heating to deposit the photopolymer as a thin film on the support. The support member may comprise any suitable rigid support of various material to which a film of the photopolymer will adhere, such as glass, paper, resin impregnated or reinforced paper, solid resinous sheets, or metal plates, such as aluminum, zinc, magnesium, or copper. The metal support may be in plate, sheet, or foil form, and may be smooth or grained. The metal surface may also be an "alpha-alumina" surface, that is an aluminum surface which has a thin film of aluminum oxide thereover. Such a surface may be derived by dipping a sheet of aluminum into a 70 percent concentrated nitric acid, rinsing with water, then into hot water (temperature of about 170° F.) having a pH of 8 or 9 for approximately 3 minutes, after which the plate is rinsed and dried. It has been found that the thin coating of aluminum oxide causes the photopolymer to adhere better to the support thereby permitting development after exposure with emulsion developers.

The precise composition of the phenoxy-cinnamate-sensitizer solution is variable to a considerable extent, with the usual requirement being that there should be at least about ½ percent by weight per unit volume of the photopolymer in order to be able to form an image on a support when the photopolymer is later subjected to actinic light. The preferred range of photopolymer is from about ½ to 15 weight percent per unit volume, although it can be greater if desired. Since generally, the greater the quantity of polymer which is present in the solution, the thicker the resulting film will be and thus the longer it must be exposed to form the image, it is generally desirable to restrict the quantity of polymer to the limits indicated. The sensitizing agent is usually in the range of about 5 to 20 percent by weight based on the polymer, although this quantity may also vary considerably, with the more sensitizing agent employed, the more photosensitive the resulting film. For practical reasons, the quantity will be kept within the above range. The remainder of the solution is, of course, comprised of the solvent.

There may also be included in the polymer compositions any of the well-known compounds which serve as effective accelerators of the photopolymerization by facilitating the formation of cross-linkages. One suitable such compound is dicinnamylidene vinyl ketone, although many others may also be used.

These compositions are usually quite stable if stored away from actinic light, but it may also be desirable to include a small quantity of a polymerization inhibitor, such as for example hydroquinone, sufficient to maintain the stability of the polymer but insufficient to prevent or materially affect polymerization when the composition is later exposed to the actinic light.

After the support member has been coated with a film of the photopolymer-sensitizer solution, it is dried and then exposed to light, preferably ultraviolet light (although a wide range of different light sources may be used, depending upon the structure of the light sensitive polymer and on the sensitizer used) through a stencil or negative, template or pattern. Such exposure polymerizes the composition by producing cross-linking or dimerisation of the double bonds of the cinnamate substituent within the polymer, and thereby converts the polymer from one which is soluble to one which is insoluble in the particular solvent which is used. Such cross-linking also makes the polymer stronger and more resistant to acids, alkali and solvents. The duration of the exposure is, of course, widely variable depending upon the intensity of the light source, the precise composition of the polymer, the thickness of the film, etc. The exposure will generally be equivalent to about 10 to 100 lux units at 3,000 foot candles. The unexposed areas will, of course, remain soluble thereby enabling the image to be solvent developable. The exposed support and polymer film is washed with the solvent to remove the non-exposed areas. Because of the differential insolubility which has thus been created, the solvent developer may be the same solvent in which the polymer composition and sensitizing agent were dissolved, although, of course, it may be any of those listed above in which the phenoxy-cinnamate polymer is soluble.

The exposed support and film may also be developed by use of an emulsion developer, i.e., a developing compound in the form of an emulsion, or suspension of droplets of one liquid in another in which the first liquid is insoluble. There are several such compounds which are suitable for this purpose. The following compound, however, has been found to be especially advantageous and is therefore the preferred emulsion developer, although others may also be used: 12 grams of a carbon black dispersion sold under the trade name "RBH Carbon Black 2064" and 16 grams of Harris Triple Ink (a lithographic rub-up ink) coloring agents; 57 ml. of xylene and 90 ml. of cyclohexanone solvents; 4 grams of "Pluronic F68," 2 ml. of "Tergitol TMN," and 39 ml. of "Dowanol PM" wetting agents; 56 ml. of Harris C 125 desensitizing agent and 12 ml. of glycerin. It will be noted that the above formulation includes lithographic plate "desensitizing agents," i.e., agents which cause the surface of the support to be hydrophilic as opposed to oleophilic in the areas where the polymer was removed by the developer. The use of developers of this type thus eliminate the necessity of subsequently desensitizing the plate after development.

If desired, the coated plate may be subjected to post baking to increase further the strength of the polymer film by causing additional cross-linking. For example, the film and support may be oven baked at a temperature below the softening temperature of the support, for example below about 180° C. when an aluminum plate is used. In such case, the film and support may be heated at about 150° C. for a period of about 2 minutes.

The coated plate may also, prior to subjection to the ultraviolet light, be predried by heating to about 150° F.

for 6 or 7 minutes to drive off residual solvent. Such heating will not polymerize the polymer, but is designed for the purpose of thoroughly drying the film to facilitate cross-linking when later exposed to the actinic light.

The photopolymer of this invention may be used in the manner described in any lithographic or photomechanical process in which an oleophilic light exposed residue is permissible. Accordingly, the exposed photopolymer may be used as the printing areas of a lithographic surface plate or a letterpress plate, or for etching wherein the light exposed polymer forms a resist. Similarly, the photopolymer may be used in preparing etched electrical circuits and the like in which a support having a metal surface is coated with a thin film of the polymer and an electrical circuit is reproduced thereon by light exposure through a suitable negative. The unexposed portions of the polymer are then washed away and the underlying metal surface is dissolved by an acid. The hardened light exposed resist formed from the polymer is thereafter removed to leave a metal path over the support in the form of the desired circuit.

One of the primary advantages of the present photopolymer is the chemical stability of its light sensitive groups which permits the polymer to be used directly in contact with a support member including a metal surface. The polymer is retained on the surface of the support by a very firm and secure physical bond therewith. In some instances, however, it may be desirable to alter the strength of this bond, either by increasing or decreasing it. This result may be achieved by use of an intervening layer. Numerous materials are suitable for use as the intervening layer, with the layer preferably being hydrophilic for lithographic plate applications. The sublayer may, therefore, depending upon the particular surface to which it is being applied, comprise a silicate such as obtained by treating a metal plate with sodium silicate, or it may comprise polyacrylic acid, a polysilane-acrylic copolymer, water-soluble linear copolymers of alkyl vinyl ethers and maleic anhydride, or methylated methylol melamines or ethylated methylol melamines. Reference may also be made to United States Patents Nos. 2,991,204, 2,715,619, 2,796,362, 2,554,475, 2,559,578 and British Patents 819,-539 and 864,033 for a further description of materials which may suitably be used.

This invention will be better understood by reference to the following specific but nonlimiting examples.

EXAMPLE I

A 500 ml. flask was fitted with a thermometer, mechanical stirrer, reflux condenser, dropping funnel, and a gas inlet. 20 grams of the above-described phenoxy resin was placed in the flask along with 50 cc. of dioxane. 20 grams of cinnamoyl chloride was then added and the flask was rapidly heated to a temperature of about 80° C. while maintaining constant agitation. After the reaction had begun, as evidenced by evolution of HCl gas, the temperature was increased to about 100° C. The solution was refluxed at this temperature and under atmospheric pressure for 1 hour, and a stream of dry air was passed over the solution to carry off the hydrogen chloride gas as formed. In the usual manner, the HCl gas was collected in water which was titrated to determine when the reaction was completed.

The phenoxy-cinnamate product was precipitated in methanol, which is compatible with the dioxane solvent but not with the polymer. The precipitate was thereafter ground in water and then methanol and dried. The yield was 28 grams.

EXAMPLE II 1 gram of the phenoxy-cinnamate product of Example I was placed in a 150 ml. flask along with 100 cc. of toluene and 0.1 gram of Michler's ketone sensitizing agent at ambient temperature and under atmospheric pressure with stirring to produce a solution. This solution was coated on a wire brushed aluminum surface, dried to remove the residual solvent, and exposed for 40 lux units at 3,000 foot candles in contact with a negative. A luxometer unit (lux) is a standard analytical means for measuring cumulative quantities of light in terms of intensity time units and is equal to 13,000 foot candle seconds of illumination, wherein the intensity of light is at least 2,000 foot candles supplied by a white flame carbon arc source.

The plate was then developed by spraying with toluene to remove the unexposed areas. After drying, an image could be seen in the areas where the photopolymer had been exposed. The plate was subsequently desensitized by the use of a silicate solution to leave a water attractive layer on the areas where the unexposed polymer was removed. The plate was then rinsed with water, rubbed up with a water solution of gum arabic of about 7° Baumé and lithographic-rub up ink to facilitate examination of the plate. A good image on a clean background was obtained, and the plate made by this procedure was press tested for over 100,000 impressions.

EXAMPLE III

Using the procedure and system of Example I, 1000 grams of phenoxy resin was placed in the flask with 3000 cc. of n-methyl pyrrolidone solvent. 1000 grams of cinnamoyl chloride was then added, and the flask was rapidly heated to a temperature of about 100–112 degrees C. with stirring. The solution was heated at this temperature and under atmospheric pressure for 1 hour.

The phenoxy-cinnamate product formed by the above reaction was precipitated in methanol. The precipitate was thereafter ground in water and then methanol and dried. The yield was 1680 grams.

EXAMPLE IV 2 grams of the phenoxy-cinnamate of Example III was placed in a flask along with 100 cc. of toluene and 0.2 gram of Michler's ketone at ambient temperature and under atmospheric pressure to produce a solution in the same manner as in Example II. The solution was applied to an "alpha-alumina" plate, dried to remove residual solvent, and exposed for 45 lux units at 3,000 foot candles in contact with a negative.

The plate was then developed by rubbing with the emulsion developer previously described to remove the unexposed areas to produce an image. After drying, the image could be clearly seen in the areas where the photopolymer had been exposed. A good image on a clean background was obtained by use of the plate, and the plate was press tested for 100,000 impressions.

EXAMPLE V 5 grams of the phenoxy-cinnamate polymer of Example III was dissolved in 100 cc. of toluene with 0.5 gram of Michler's ketone as in Example IV. The solution was applied to a printed circuit board, dried to remove residual solvent, and exposed for 100 lux units at 3,000 foot candles in contact with a negative of a printed circuit to prepare the resist.

The plate was developed by rocking in toluene to remove the unexposed areas. The exposed, insoluble image, after drying, served as a resist when the plate was etched with a 42° Bé. ferric chloride to prepare a printed circuit.

It is thus seen that the objects of this invention have been achieved by means of the unique photopolymer disclosed and described herein. It is seen that plates made from this photopolymer are capable of longer use, as for example being capable of production in excess of 100,000 impressions as compared to 25,000 to 50,000 impressions which are usually obtained with plates employing a diazo type photopolymer. Moreover, the present photopolymer is easier to prepare and purify, has a higher stability before exposure, especially toward oxygen, humidity and temperature, has a wider range of photosensitivity, a more desirable printing surface, a longer storage life, readily forms a film over a support member, and may desirably be used as an etching resist as in the preparation of printed circuits.

Other modes of applying the principle of the invention may be employed, change being made as regards the details described, provided the features stated in any of the following claims, or the equivalent of such be employed.

I therefore, particularly point out and distinctly claim as my invention:

1. A light sensitive photopolymerizable composition comprising a phenoxy-cinnamate polymer having a molecular weight of at least approximately 20,000 containing as a recurring structure:

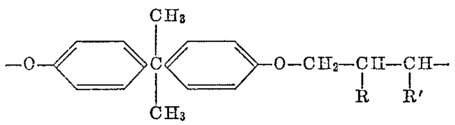

wherein R and R′ are members selected from the group consisting of hydrogen and cinnamate substituents at least one of said R and R′ being a cinnamate substituent, the terminal groups of said photopolymerizable composition being selected from the class consisting of hydroxyl and cinnamate groups.

2. The composition of claim 1 including a light sensitizing agent.

3. The composition of claim 2 in which said sensitizing agent is Michler's ketone.

4. The composition of claim 2 in which said phenoxy-cinnamate polymer and sensitizing agent are in solution.

5. The composition of claim 4 in which said solvent is toluene.

6. The composition of claim 4 in which said polymer comprises at least about ½ percent by weight per unit volume, said sensitizing agent comprises at least about 5 weight percent based on said polymer and the remainder of said solution comprises solvent.

7. The composition of claim 6 in which said polymer comprises in the range of about ½ to 15 percent by weight per unit volume, said sensitizing agent comprises in the range of about 5 to 20 weight percent based on said polymer, the remainder of said solution being solvent.

8. A light sensitive photopolymerizable composition comprising a phenoxy-cinnamate polymer having a molecular weight of at least approximately 20,000 containing as a recurring structure:

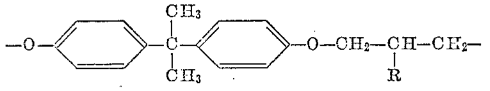

wherein R is a cinnamate substituent the terminal groups of such photopolymerizable composition being selected from the class consisting of hydroxyl and cinnamate groups.

9. The composition of claim 8 in which said cinnamate substituent is:

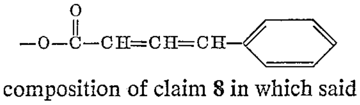

10. The composition of claim 8 in which said cinnamate substituent is:

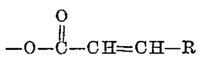

wherein R is a member selected from the group consisting of the phenyl radical and a substituted phenyl radical.

11. The composition of claim 8 in which said cinnamate substituent contains conjugated unsaturation.

12. A lithographic plate comprising a support member and a film formed from a light sensitive photopolymerizable composition adhered to the surface of said support, said composition comprising a phenoxy-cinnamate polymer having a molecular weight of at least approximately 20,000 containing as a recurring structure:

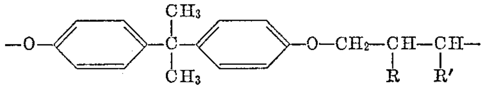

wherein R and R′ are members selected from the group consisting of hydrogen and cinnamate substituents, at least one of said R and R′ being a cinnamate substituent, the terminal groups of said photopolymerizable composition being selected from the class consisting of hydroxyl and cinnamate groups.

13. The plate of claim 12 in which said photopolymerizable composition includes a light sensitizing agent.

14. The plate of claim 13 in which selected portions of said film have been exposed to actinic light.

15. The plate of claim 14 in which the non-exposed areas of said film have been removed from said support.

16. An etching resist comprising a light hardened film formed from a photopolymerizable composition, said composition comprising a (high molecular weight) phenoxy-cinnamate polymer having a molecular weight of at least approximately 20,000 containing as a recurring structure:

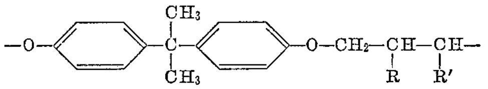

wherein R and R′ are members selected from the group consisting of hydrogen and cinnamate substituents, at least one of said R and R′ being a cinnamate substituent, the terminal groups of such photopolymerizable composition being selected from the class consisting of hydroxyl and cinnamate groups.

17. The plate of claim 13 in which said support has a coating of aluminum oxide thereon separating said photopolymerizable composition from said support.

18. A photopolymer for use in lithographic and photo mechanical processes comprising a phenoxy-cinnamate polymer having a molecular weight of at least approximately 20,000 containing as a recurring structure:

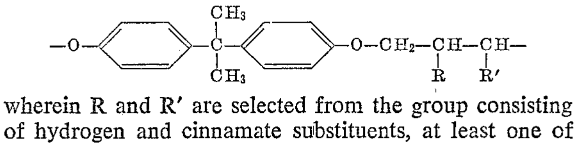

wherein R and R′ are selected from the group consisting of hydrogen and cinnamate substituents, at least one of said R and R′ being a cinnamate substituent, said phenoxy cinnamate photopolymer having terminal groups selected from the class consisting of hydroxyl and cinnamate groups and comprising the reaction product of a straight chain polyhydroxy ether having about 6 percent by weight hydroxyl groups and a cinnamoylating agent.

References Cited

UNITED STATES PATENTS

| | | | |
|---|---|---|---|
| 2,610,120 | 9/1952 | Minsk et al. | 96—115 |
| 2,890,202 | 6/1959 | Parker | 260—47 |
| 3,019,106 | 1/1962 | Adams | 96—33 |
| 3,295,974 | 1/1967 | Erdmann | 96—35 |

FOREIGN PATENTS

| | | |
|---|---|---|
| 794,572 | 5/1958 | Great Britain. |
| 921,530 | 3/1963 | Great Britain. |

NORMAN G. TORCHIN, *Primary Examiner.*

R. H. SMITH, *Assistant Examiner.*